United States Patent [19]
Rho

[11] Patent Number: 5,861,334
[45] Date of Patent: Jan. 19, 1999

[54] METHOD FOR FABRICATING SEMICONDUCTOR DEVICE HAVING A BURIED CHANNEL

[75] Inventor: Kwang Myoung Rho, Ichon, Rep. of Korea

[73] Assignee: Hyundai Electronics Industries Co.,, Ichon, Rep. of Korea

[21] Appl. No.: 692,622

[22] Filed: Aug. 6, 1996

[30] Foreign Application Priority Data

Aug. 7, 1995 [KR] Rep. of Korea .............. 95-24299

[51] Int. Cl.⁶ .................................................. H01L 21/336
[52] U.S. Cl. ........................ 438/282; 438/289; 438/546
[58] Field of Search .................... 438/217, 282, 438/289, 291, 526, 527, 545, 546, 919

[56] References Cited

U.S. PATENT DOCUMENTS

| | | | |
|---|---|---|---|
| 4,145,233 | 3/1979 | Sefick et al. | 437/289 |
| 4,680,603 | 7/1987 | Wei et al. | 438/305 |
| 4,771,014 | 9/1988 | Liou et al. | 438/217 |
| 4,943,537 | 7/1990 | Harrington, III | 438/289 |

*Primary Examiner*—Chandra Chaudhari
*Attorney, Agent, or Firm*—Thelen Reid & Priest LLP

[57] ABSTRACT

A method for fabricating a semiconductor device having a buried channel structure, in which impurities having the same conductive type as a well are ion implanted, to increase the ion density beneath the buried channel, thereby enhancing the short channel characteristic and smooth on/off characteristic of MOSFET.

10 Claims, 5 Drawing Sheets

METHOD FOR FABRICATING SEMICONDUCTOR DEVICE HAVING A BURIED CHANNEL

BACKGROUND OF THE INVENTION

1. Field of the invention

The present invention relates, in general, to a method for fabricating a semiconductor device applicable for DRAM or ASIC and, more particularly, to a method for fabricating a semiconductor device having a buried channel structure.

2. Description of the Prior Art

In a typical process for FET, an implant which is different in type from the well formed on the surface of a semiconductor device (hereinafter referred to as "counter implant"), is used to form a buried channel at the lower channel region between a source and a drain. Such a buried channel plays the role of controlling the threshold voltage of the resulting FET device, to minimize the short channel effect.

In order to better understand the background of the invention, a description will be given of conventional channel structures, in conjugation with various drawings.

Referring to FIG. 1, a conventional device of buried channel structure is shown. As shown in FIG. 1, an N-type well 2 is formed in the upper region of a P-type semiconductor substrate 1 in a diffusing manner. Then, impurities are implanted in the N-type well 2 to a certain depth, to form a buried channel 3, after which a gate oxide film 4 and a gate 5 are formed in sequence over the N-type well 2, followed by the formation of an oxide film spacer 6 at the side wall of the gate 5. Using the gate 5 and the oxide film spacer 6 as a mask, P-type ions are doped in the N-type well 2, to form a drain/source 7.

Referring to FIG. 2, there is plotted the doped N-type ion densities of the N-well cut through line A–A' of FIG. 1. In this plot, reference symbol "a" represents the N-type ion density within the N well 2 whereas reference symbol "b" stands for the doped ion density in a buried channel converted into P-type and reference symbol "c" for the doped N-type ion density when the buried channel 3 is not formed.

Such formation of a well through diffusion as mentioned above, has a significant problem in that heat treatment is required at a high temperature for an extended period of time.

To overcome this problem, a profiled or retrograde well formation technique, which can bring a significantly improve the performance of the device, has been developed. For example, a buried channel PMOSFET can be created with a counter implant in a semiconductor device having a profiled N well structure. This characteristic can be in described in detail with reference to FIG. 3. FIG. 3 is a plot showing the doped ion densities of the profiled well cut like FIG. 1 (that is, line A–A') in a MOSFET having a buried channel 3 structure.

In the figure, reference symbol "d" represents the doped ion density within the N well 2, reference symbol "e" represents the doped ion density in the area where the buried channel is created, reference symbol "g" represents the doped ion density of the N well 2 located at the lower portion of the buried channel 3 and reference symbol "f" represents the doped ion density in the upper part of the N well 2 when omitting the count implant for the buried channel. It is apparent that the doped ion densities constructed by the profiled or retrograde well technique is much lower than those in the N well constructed through diffusion. In other words, the dose of impurity required for forming the buried channel 3 is lower than that required for forming a well by diffusion.

However, the MOSFET of such a buried channel structure is significantly problematic in that the short channel characteristic is deteriorated because the N type ion density in the region beneath the buried channel is low, as indicated by reference symbol "f".

SUMMARY OF THE INVENTION

Therefore, it is an object of the present invention to provide a method for fabricating a semiconductor device by which the short channel characteristic of a semiconductor device having a profiled well and buried channel can be improved.

In accordance with a first aspect of the present invention, a method for fabricating a semiconductor device, comprising the steps of: forming a second conductive type profiled well in a first conductive type semiconductor substrate through high energy ion implantation; ion-implanting second conductive type impurities into the upper portion of the well; producing a buried channel by ion implanting first conductive type impurities into the region into which said second conductive type impurities are implanted; and forming a gate oxide film and a gate electrode on the surface of the semiconductor substrate.

In accordance with a second aspect of the present invention, there is provided a method for fabricating a semiconductor device, comprising the steps of: forming a second conductive type profiled well in a first conductive type semiconductor substrate through high energy ion implantation; ion-implanting first conductive type impurities into said well, to form a buried channel in the upper portion of the well; ion-implanting second conductive type impurities into the region beneath the buried channel; and forming a gate oxide film and a gate electrode on the surface of the semiconductor substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
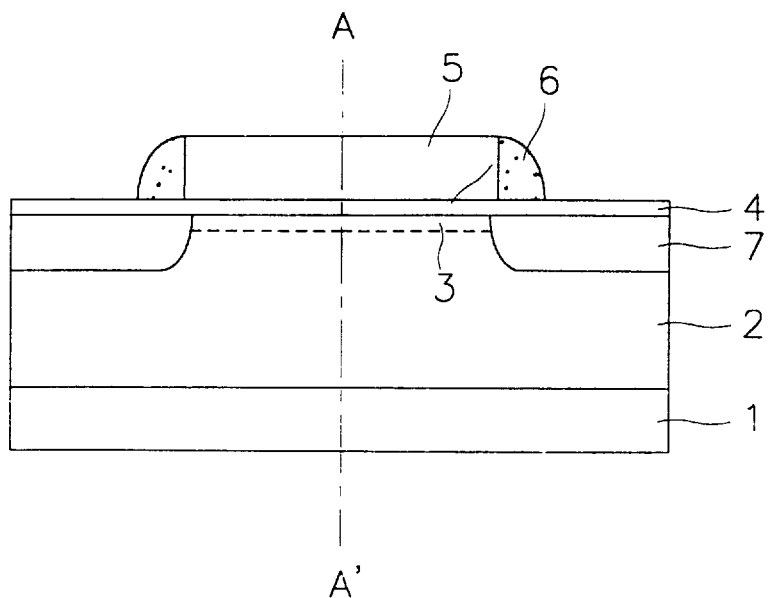
FIG. 1 is a schematic cross sectional view of a conventional PMOSFET having a buried channel structure.
Figure 2:
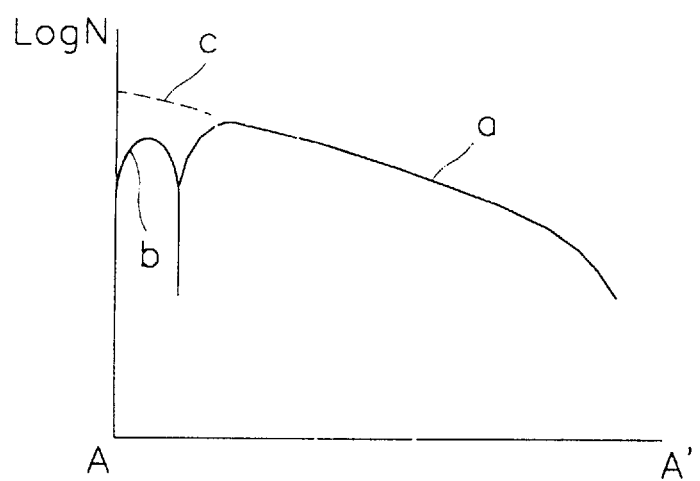
FIG. 2 is a plot showing the doped N-type ion densities in the N-well cut through line A–A' of FIG. 1.
Figure 3:
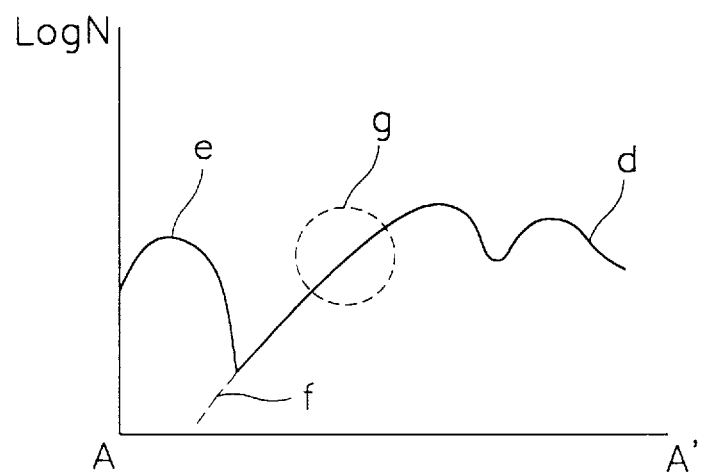
FIG. 3 is a plot showing the doped ion densities of the profiled (or retrograde) well having a buried channel structure.

The application of the preferred embodiment of the present invention is best understood with reference to the accompanying drawings, wherein like reference numerals are used for like and corresponding parts, respectively.

Figure 4:
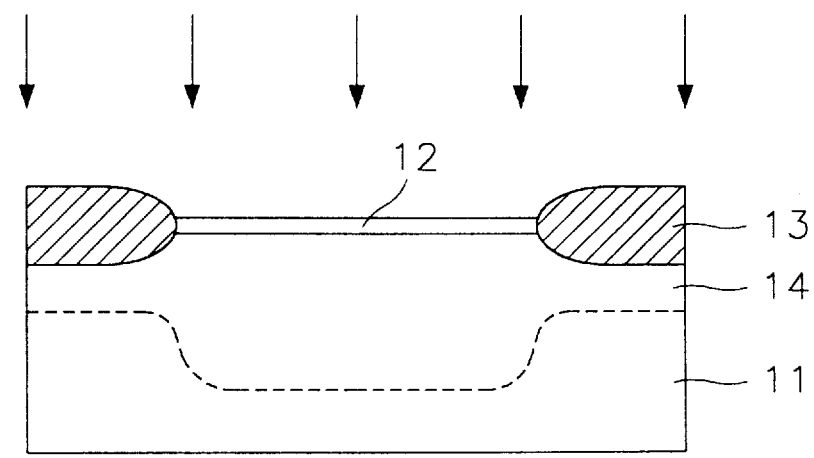
FIGS. 4 through 7 are schematic cross sectional views showing a method for fabricating a PMOSFET having a profiled well and buried channel structure, according to the present invention.
Figure 5:
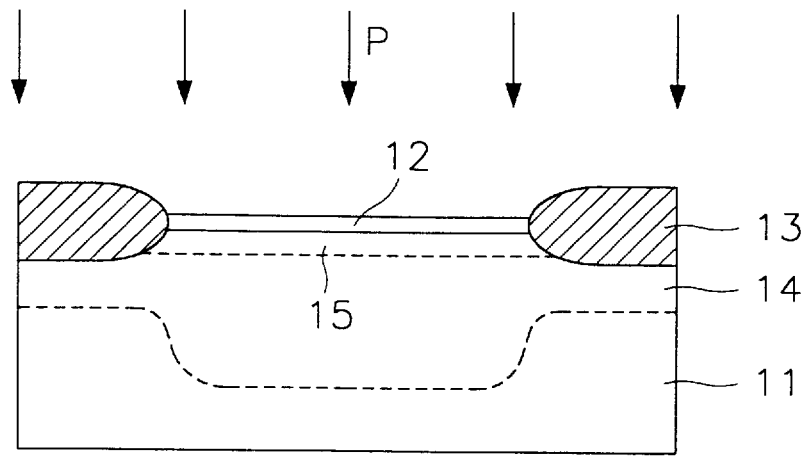

Referring to FIGS. 4 and 5, a fabricating method of the semiconductor device according to the present invention is illustrated.

First, a sacrificial oxide film 12 is produced on a P type semiconductor substrate 11, followed by the formation of field oxide film 13 through LOCOS process, as shown in FIG. 4. Then, a profiled N-well 14 is formed within the semiconductor substrate 11 by implanting N-type impurities as indicated by arrows.

FIG. 5 is a cross section taken after an N type density-enhanced region 15 is formed in the upper portion of the profiled well 14. Since the upper portion of the profiled well 14 is low in N type density, it should be compensated with additional impurities for a buried channel to be formed later. For such compensation, phosphorous ions, for example, are implanted into the semiconductor substrate 11 at a dose of $3 \times 10^{12}$ and at 40 KeV, as indicated by arrows.

Figure 6:
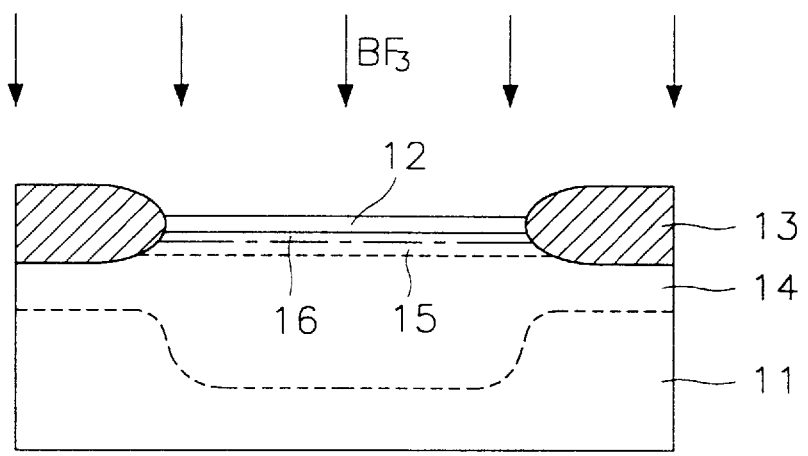

FIG. 6 is a cross section taken after a buried channel 16, which serves as a counter implant, is formed within the N type density-enhanced region 15. The channel may be formed by ion implantation into the semiconductor substrate 11 using, for example, $BF_2$ as a source at a dose of $8 \times 10^{12}$ under an energy of 20 KeV.

Figure 7:
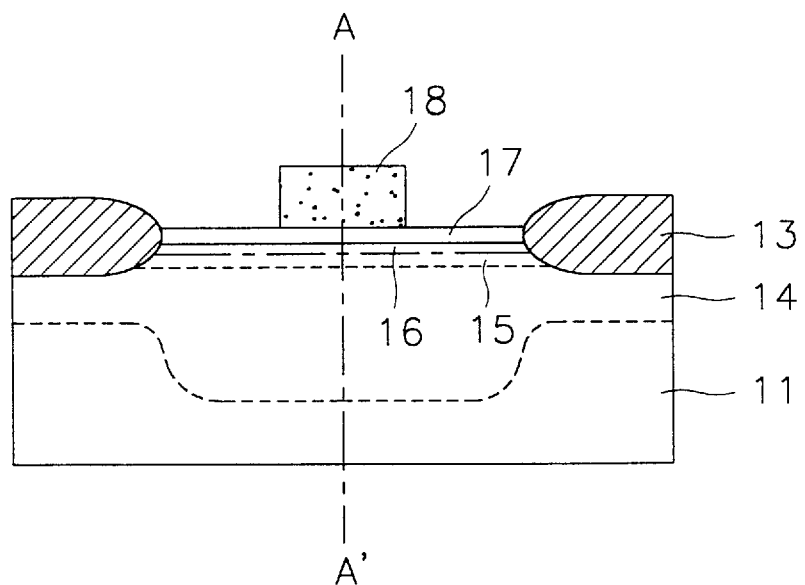

Finally, FIG. 7 is a cross section taken after a PMOSFET is fabricated. On the bared surface of the semiconductor device in which the sacrificial oxide film 12 has been removed, a gate oxide film 17 is formed. Then, a polysilicon is deposited on the gate oxide film 17 and patterned, to create a gate electrode 18.

Alternatively, the process suggested in FIGS. 5 and 6 may be reversed to accomplish the structure of the present invention.

Figure 8:
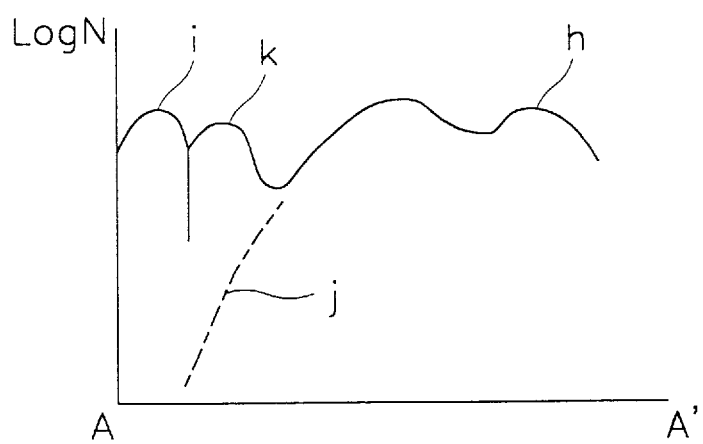
FIG. 8 is a plot showing the doped ion densities in the well taken through line A–A' of FIG. 7.

With reference to FIG. 8, the ion densities in the well taken through line A–A' of FIG. 7 are plotted. In this figure, reference symbol "h" represents the doped ion density within the N well, reference symbol "i" represents the doped ion density in the buried channel 3 formed in the upper portion of the N well, reference symbol "k" represents the doped ion density in the region formed beneath the buried channel 3, and reference symbol "k", indicating a dotted line, represents the doped ion density of the N well occurring when omitting the counter implant for a buried channel. As is apparent from this plot, the doped ion density is enhanced in such regions.

Figure 9:
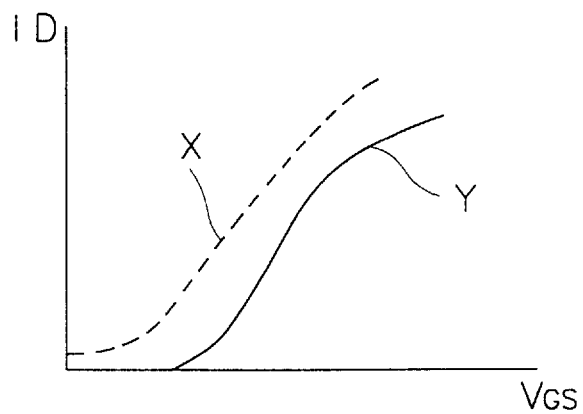
FIGS. 9 and 10 are graphs showing a comparison of characteristics between PMOSFETs fabricated by the conventional profiled well technique, according to the present invention.
Figure 10:
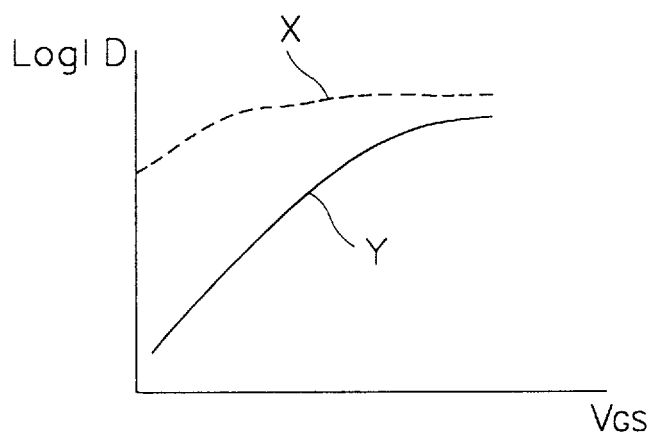

Turning to FIGS. 9 and 10, a comparison of characteristics between a PMOSFET fabricated by the conventional profiled well technique in accordance with the present invention is provided. In these figures, the plot represented by reference symbol "X" shows the change of $V_{GS}$ with regard to ID in the PMOSFET carrying the conventional profiled well, while the plot represented by reference symbol "Y" shows the change in the PMOSFET of the present invention. According to these figures, the conventional PMOSFET cannot be accurately "off" although the gate voltage is reduced whereas the PMOSFET of the present invention exhibits accurate on/off characteristic.

As described hereinbefore, the short channel and on/off characteristics can be improved by enhancing the N type ion density at the region beneath the buried channel of a PMOSFET carrying a profiled well.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for fabricating a semiconductor device, comprising:

forming a field oxide film on a first conductive type semiconductor substrate by a LOCOS process;

forming a second conductive type profiled well in the first conductive type semiconductor substrate through high energy ion implantation;

ion-implanting second conductive type impurities into an upper portion of the well, to compensate a second conductive type impurity density in a buried channel;

forming the buried channel by ion implanting first conductive type impurities into the upper portion of the well with a lower implanting energy than the ion-implanting energy of the second conductive type impurities; and forming a gate oxide film and a gate electrode on the surface of the semiconductor substrate.

2. A method in accordance with claim 1, wherein
   said first conductive type is a P type and
   said second conductive type is an N type.

3. A method in accordance with claim 1, wherein said second conductive type impurities are implanted by:
   using phosphorous as a source
   at a dose of $3 \times 10^{12}$
   under an energy of 40 KeV.

4. A method in accordance with claim 1, wherein said buried channel is produced by:
   using $BF_2$ as a source
   at a dose of $8 \times 10^{12}$
   under an energy of 20 KeV.

5. A method for fabricating a semiconductor device, comprising:

forming a field oxide film on a first conductive type semiconductor substrate by a LOCOS process;

forming a second conductive type profiled well in the first conductive type semiconductor substrate through high energy ion implantation;

forming a buried channel in an upper portion of the well by ion-implanting first; conductive type impurities into said wells:

ion-implanting second conductive type impurities down to the region beneath the buried channel, to compensate a second conductive type impurity density between the buried channel and the upper portion of the well; and forming a gate oxide film and a gate electrode on the surface of the semiconductor substrate.

6. A method in accordance with claim 5, wherein:
   said first conductive type is a P type and
   said second conductive type is an N type.

7. A method in accordance with claim 5, wherein said second conductive type impurities are implanted by:
   using phosphorous as a source
   at a dose of $3 \times 10^{12}$
   under an energy of 40 KeV.

8. A method in accordance with claim 5, wherein said buried channel is produced by:
   using $BF_2$ as a source
   at a dose of $8 \times 10^{12}$
   under an energy of 20 KeV.

9. A method for fabricating a semiconductor device, comprising:

forming a field oxide film on a P type semiconductor substrate by a LOCOS process;

forming an N well in the substrate through high energy ion implantation;

ion-implanting N type impurities with a dose of at a dose of $3\times10^{12}$ under an energy of 40 KeV into the well, to compensate an N type impurity density in a buried channel;

forming the buried channel by ion implanting P type impurities at a dose of $8\times10^{12}$ under an energy of 20 KeV at an upper portion of the well; and forming a gate oxide film and a gate electrode on the surface of the substrate.

10. A method for fabricating a semiconductor device, comprising:

forming a field oxide film on a P type semiconductor substrate by a LOCOS process;

forming an N well in the substrate through high energy ion implantation;

forming a buried channel by ion implanting P type impurities at a dose of $8\times10^{12}$ under an energy of 20 KeV at an upper portion of the well;

ion implanting N type impurities at a dose of $3\times10^{12}$ under an energy of 40 KeV into the N well, to compensate an N type impurity density between the buried channel and the upper portion of the N well; and forming a gate oxide film and a gate electrode on the surface of the substrate.

* * * * *